(12) United States Patent
Hattori et al.

(10) Patent No.: US 7,435,525 B2
(45) Date of Patent: Oct. 14, 2008

(54) POSITIVE PHOTOSENSITIVE RESIN COMPOSITION, METHOD FOR FORMING PATTERN, AND ELECTRONIC PART

(75) Inventors: Takashi Hattori, Ibaraki (JP); Yasuharu Murakami, Ibaraki (JP); Hiroshi Matsutani, Ibaraki (JP); Masayuki Ooe, Ibaraki (JP); Hajime Nakano, Ibaraki (JP)

(73) Assignee: Hitachi Chemical Dupont Microsystems Ltd., Tokyo (JP)

( * ) Notice: Subject to any disclaimer, the term of this patent is extended or adjusted under 35 U.S.C. 154(b) by 8 days.

(21) Appl. No.: 10/576,494

(22) PCT Filed: Mar. 11, 2005

(86) PCT No.: PCT/JP2005/004350

§ 371 (c)(1),
(2), (4) Date: Apr. 20, 2006

(87) PCT Pub. No.: WO2005/109099

PCT Pub. Date: Nov. 17, 2005

(65) Prior Publication Data

US 2007/0122733 A1    May 31, 2007

(30) Foreign Application Priority Data

May 7, 2004   (JP) ............................. 2004-139149
Jun. 23, 2004  (JP) ............................. 2004-185613
Aug. 5, 2004   (JP) ............................. 2004-229285

(51) Int. Cl.
G03F 7/023   (2006.01)
G03F 7/30    (2006.01)

(52) U.S. Cl. .................... 430/191; 430/18; 430/192; 430/193; 430/326; 430/330

(58) Field of Classification Search ................ 430/191, 430/192, 193, 18, 326, 330
See application file for complete search history.

(56) References Cited

U.S. PATENT DOCUMENTS

| | | | |
|---|---|---|---|
| 4,395,482 A | 7/1983 | Ahne et al. | |
| 6,143,467 A | 11/2000 | Hsu et al. | |
| 6,232,032 B1 * | 5/2001 | Nunomura et al. | 430/191 |
| 6,929,891 B2 * | 8/2005 | Rushkin et al. | 430/18 |
| 6,933,087 B2 * | 8/2005 | Suwa et al. | 430/7 |
| 7,150,947 B2 * | 12/2006 | Nunomura et al. | 430/18 |
| 2003/0143480 A1 | 7/2003 | Ueda et al. | |
| 2004/0013975 A1 | 1/2004 | Kon et al. | |
| 2005/0014876 A1 | 1/2005 | Fujita et al. | |

FOREIGN PATENT DOCUMENTS

| | | |
|---|---|---|
| EP | 0917000 | 5/1999 |
| JP | 49-11541 | 2/1974 |
| JP | 50-40922 | 4/1975 |
| JP | 52-13315 | 2/1977 |
| JP | 54-145794 | 11/1979 |
| JP | 56-038038 | 4/1981 |
| JP | 59-108031 | 6/1984 |
| JP | 59-219330 | 12/1984 |
| JP | 59-220730 | 12/1984 |
| JP | 59-231533 | 12/1984 |
| JP | 59-232122 | 12/1984 |
| JP | 60-006729 | 1/1985 |
| JP | 60-072925 | 4/1985 |
| JP | 61-057620 | 3/1986 |
| JP | 64-046862 | 2/1989 |
| JP | 64-060630 | 3/1989 |
| JP | 1-46862 | 10/1989 |
| JP | 03-000763 | 1/1991 |
| JP | 04-031861 | 2/1992 |
| JP | 04-046345 | 2/1992 |
| JP | 05-179153 | 7/1993 |
| JP | 07-219228 | 8/1995 |
| JP | 08-319307 | 12/1996 |
| JP | 09-183846 | 7/1997 |
| JP | 10-186664 | 7/1998 |
| JP | 10-307393 | 11/1998 |
| JP | 11-202489 | 7/1999 |
| JP | 11-338154 | 12/1999 |
| JP | 11-352702 | 12/1999 |
| JP | 2000-056559 | 2/2000 |
| JP | 2000-338664 | 12/2000 |
| JP | 2001-042527 | 2/2001 |
| JP | 2001-183835 | 7/2001 |
| JP | 2001-194791 | 7/2001 |
| JP | 2001-337453 | 12/2001 |
| JP | 2002-526793 | 8/2002 |
| JP | 2003-221444 | 8/2003 |
| JP | 2004-045513 | 2/2004 |
| JP | 2004-077551 | 3/2004 |
| JP | 2004-341248 | 12/2004 |
| JP | 2005-043883 | 2/2005 |

OTHER PUBLICATIONS

J. Macromol. Sci. Chem., A24, 12, 1407, 1987.
Macromolecules, 23, 4796-4802, 1990.

* cited by examiner

Primary Examiner—John S Chu
(74) Attorney, Agent, or Firm—Antonelli, Terry, Stout & Kraus, LLP.

(57) ABSTRACT

Provided is a positive photosensitive resin composition which is advantageous not only in excellent sensitivity, resolution and adhesion, but also in excellent heat resistance even when the composition is cured by a low-temperature process at equal to or lower than 280° C., as well as low water absorption and capability to give a pattern with favorable configuration. The positive photosensitive resin composition contains: (a) alkaline aqueous solution-soluble polyamide having a polyoxazole precursor structure; (b) an o-quinonediazide compound; and (c) a latent acid generator which generates acid upon heating. The composition optionally further contains (d) a compound having a phenolic hydroxyl group or (e) a solvent.

8 Claims, 1 Drawing Sheet

POSITIVE PHOTOSENSITIVE RESIN COMPOSITION, METHOD FOR FORMING PATTERN, AND ELECTRONIC PART

TECHNICAL FIELD

The present invention relates to a heat-resistant positive photosensitive resin composition containing a polyoxazole precursor having photosensitivity, a method for forming a pattern using the composition, and an electronic part.

BACKGROUND ART

In semiconductor devices, polyimide resins having excellent heat resistance and electrical properties as well as excellent mechanical properties have conventionally been used in surface protecting films and interlayer insulating layers. In recent years, as the integration degree of semiconductor devices is increasing and the size thereof is decreasing, there are increasing demands on resin encapsulation packages to be reduced in thickness or size. For meeting these demands, surface mount modes such as LOC (lead on chip) or solder reflow are employed. Consequently, there are increasing demands on a polyimide resin to have more suitable properties as a protective film on the uppermost surface of a semiconductor circuit. That is, a polyimide resin is now becoming to be required to have better mechanical properties and heat resistance.

On the other hand, also coming into use is a photosensitive polyimide which is a polyimide resin having sensitivity properties, and which has a feature such that it can simplify the step of forming a pattern to shorten the cumbersome fabrication process.

Heat-resistant photoresists using the conventional photosensitive polyimide or a precursor thereof have been well known. Examples of negative photosensitive resins include those obtained by introducing a methacryloyl group into a polyimide precursor through an ester linkage or an ionic bond (for example, see Patent Documents 1 to 4), a soluble polyimide having photopolymerizable olefin (for example, see Patent Documents 5 to 10), and a self-sensitizing polyimide having a benzophenone skeleton and having an alkyl group at the ortho-position of the aromatic ring to which a nitrogen atom is bonded (for example, see Patent Documents 11 and 12). The uses thereof are also well known. However, the aforementioned negative photosensitive resins needs an organic solvent, such as N-methylpyrrolidone, upon development. Therefore, there has been proposed a positive photosensitive resin which can be developed with an alkaline aqueous solution.

As positive photosensitive resins, there are known a positive photosensitive resin obtained by, for example, a method in which an o-nitrobenzyl group is introduced into a polyimide precursor through an ester linkage (for example, see Non-patent Document 1), a method in which a naphthoquinonediazide compound is mixed into soluble hydroxylimide or a polyoxazole precursor (for example, see Patent Documents 13 and 14), or a method in which naphthoquinonediazide is introduced into soluble polyimide through an ester linkage (for example, see Non-patent Document 2). There are also known a photosensitive resin composition obtained by mixing naphthoquinonediazide into a polyimide precursor (for example, see Patent Document 15).

The negative photosensitive resins have a problem of poor resolution due to light-absorption wavelength of its sensitizer. In some applications, the resins also cause a problem of low yield in the production. Further, because of the limitation in the structure of the polymer used in the polyimide resin, the physical properties of the finally-obtained film are also limited, which makes the resins unsuitable for multipurpose use. Like the negative photosensitive resins, the positive photosensitive resins have similar problems of the low sensitivity or resolution due to the problem of the light-absorption wavelength of its sensitizer, and that the structure of polymer is limited.

There have been proposed materials having introduced a phenolic hydroxyl group instead of carboxylic acid, such as a material obtained by mixing a diazonaphthoquinone compound into a polybenzoxazole precursor (for example, see Patent Document 16), and a material obtained by introducing a phenolic site into polyamide acid through an ester linkage (for example, see Patent Document 17), but development properties of these materials are unsatisfactory. Further, they have problems of reduction in thickness of the unexposed portion, and peeling-off of the resin from the substrate.

For improving the development properties and the adhesion properties, there has been proposed a material containing polyamide acid having a siloxane site in the polymer skeleton (for example, see Patent Documents 18 and 19), but this material has poor storage stability due to the polyamide acid contained therein. For improving the storage stability and the adhesion property, a material having an amine end group capped with a polymerizable group has been proposed (for example, see Patent Documents 20 to 22). However, these materials use a diazoquinone compound containing a number of aromatic rings as an acid generator and hence have poor sensitivity. Further, because of the high content of the diazoquinone compound, the film after heat-curing results in having considerably low mechanical properties, which makes it difficult to practically use the materials.

For solving the above problems bound to the diazoquinone compound, materials to which a variety of chemical amplification systems is applied have been proposed. Examples thereof include chemically amplified polyimide (for example, see Patent Document 23), and chemically amplified polyimide and polybenzoxazole precursor (for example, see Patent Documents 24 to 30). However, among these, the material having high sensitivity has a low molecular weight, and hence has low film properties. On the other hand, the material having excellent film properties has a high molecular weight, and hence has unsatisfactory solubility and low sensitivity. Therefore, any of these materials are not practical, and materials which can be put into practical use have not yet been obtained.

REFERENCES

Patent Document 1: JP-S49-11541 A
Patent Document 2: JP-S50-40922 A
Patent Document 3: JP-S54-145794 A
Patent Document 4: JP-S56-38038 A
Patent Document 5: JP-S59-108031 A
Patent Document 6: JP-S59-220730 A
Patent Document 7: JP-S59-232122 A
Patent Document 8: JP-S60-6729 A
Patent Document 9: JP-S60-72925 A
Patent Document 10: JP-S61-57620 A
Patent Document 11: JP-S59-219330 A
Patent Document 12: JP-S59-231533 A
Patent Document 13: JP-S64-60630 A
Patent Document 14: U.S. Pat. No. 4,395,482
Patent Document 15: JP-S52-13315 A
Patent Document 16: JP-H1-46862 B
Patent Document 17: JP-H10-307393 A Patent Document 18: JP-H4-31861 A
Patent Document 19: JP-H4-46345 A
Patent Document 20: JP-H5-197153 A
Patent Document 21: JP-H9-183846 A
Patent Document 22: JP-2001-183835 A
Patent Document 23: JP-H3-763 A
Patent Document 24: JP-H7-219228 A
Patent Document 25: JP-H10-186664 A
Patent Document 26: JP-H11-202489 A
Patent Document 27: JP-2000-56559 A
Patent Document 28: JP-2001-194791 A
Patent Document 29: JP-2002-526793 A
Patent Document 30: U.S. Pat. No. 6,143,467
Non-patent Document 1: J. Macromol. Sci. Chem., A24, 10, 1407, 1987
Non-patent Document 2: Macromolecules, 23, 4796, 1990

DISCLOSURE OF INVENTION

Problem to be Solved by the Invention

A pattern made of photosensitive polyimide or photosensitive polybenzoxazole is usually cured at a temperature as high as about 350° C. In contrast, a recently developed MRAM (magnetoresistive RAM; non-volatile magnetoresistive memory), which is a promising memory of the next generation, is susceptible to such a high-temperature process, and production by a low-temperature process is desired. Therefore, as a material for buffer coat (surface protecting film), it is indispensable to provide with a photosensitive resin composition which can be cured at a temperature lower than the conventional curing temperature as high as about 350° C., that is, which can be cured at a temperature as low as about 280° C. or less, and which can form a cured film having physical properties comparable with the physical properties of the film cured at a high temperature.

In the present invention, by employing a specific additive together with an alkaline-developable photosensitive polybenzoxazole precursor, there is provided a positive photosensitive resin composition which can form by a low-temperature curing process a cured film having excellent heat resistance and having physical properties comparable with those of the film cured at a high temperature.

In the method for forming a pattern of the present invention, the aforementioned positive photosensitive resin composition is used and therefore, development can be performed using an alkaline aqueous solution, and a pattern having excellent sensitivity and resolution as well as favorable form can be obtained.

Further, a pattern having excellent heat resistance can be obtained by a low-temperature curing process at a temperature equal to or lower than 280° C.

The present invention also provides an electronic part which is advantageous not only in having a pattern having excellent configuration and properties, but also in capable of being cured by a low-temperature process whereby damages on the device is prevented. Thus the electronic part has high reliability and can be produced in high yield.

Means for Solving Problem

The present invention relates to:
(1) A positive photosensitive resin composition comprising:
(a) alkaline aqueous solution-soluble polyamide having a polyoxazole precursor structure;
(b) an o-quinonediazide compound; and
(c) a latent acid generator which generates acid upon heating.
(2) The positive photosensitive resin composition according to (1), wherein the component (a) is a polyamide having a repeating unit represented by the following general formula (I):

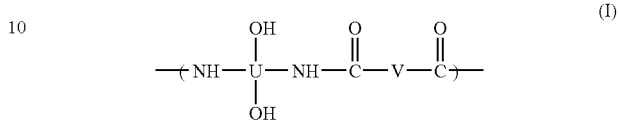

wherein U represents a tetravalent organic group, and V represents a divalent organic group.
(3) The positive photosensitive resin composition according to (1) or (2), wherein the component (c) is a salt formed of a strong acid and a base.
(4) The positive photosensitive resin composition according to any one of (1) to (3), wherein the component (c) has a decomposition starting temperature of 140 to 250° C.
(5) The positive photosensitive resin composition according to any one of (1) to (4), wherein the component (c) is a salt of toluenesulfonic acid.
(6) The positive photosensitive resin composition according to any one of (1) to (5), wherein the component (c) is an iodonium salt.
(7) The positive photosensitive resin composition according to any one of (1) to (6), further comprising (d) a compound having a phenolic hydroxyl group.
(8) The positive photosensitive resin composition according to (7), wherein the component (d) is a compound represented by the following general formula (II):

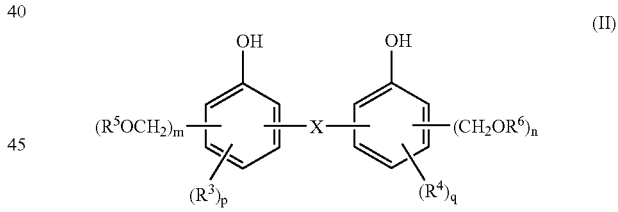

wherein X represents a single bond or a divalent organic group, each of $R^3$ to $R^6$ independently represents a hydrogen atom or a monovalent organic group, each of m and n is independently an integer of 1 to 3, and each of p and q is independently an integer of 0 to 4.
(9) The positive photosensitive resin composition according to (8), wherein the group represented by X in the general formula (II) is a group represented by the following general formula (III):

wherein each of two A's independently represents a hydrogen atom or a alkyl group having 1 to 10 carbon atoms, and optionally has any one of an oxygen atom and a fluorine atom or both.

(10) The positive photosensitive resin composition according to any one of (1) to (9), wherein the content of the component (b) and the content of the component (c) are 5 to 100 parts by weight and 0.1 to 30 parts by weight, respectively, relative to 100 parts by weight of the component (a).

(11) The positive photosensitive resin composition according to any one of (7) to (10), wherein the content of the component (b), the content of the component (c), and the content of the component (d) are 5 to 100 parts by weight, 0.1 to 30 parts by weight, and 1 to 30 parts by weight, respectively, relative to 100 parts by weight of the component (a).

(12) A method for forming a pattern comprising the steps of:
applying the positive photosensitive resin composition according to any one of (1) to (11) onto a supporting substrate and drying the composition to obtain a photosensitive resin film;
exposing the photosensitive resin film to a ray of active light having a predetermined pattern; and
developing the exposed photosensitive resin film using an alkaline aqueous solution.

(13) The method according to (12), further comprising a step of subjecting the developed photosensitive resin film to a heating treatment.

(14) The method according to (13), wherein the heating treatment is a treatment of irradiating the film with a pulse of microwave while changing the frequency thereof.

(15) The method according to (13) or (14), wherein the heating treatment is conducted at a temperature equal to or lower than 280° C.

(16) An electronic part comprising an electronic device having a layer of pattern obtained by the method for forming a pattern according to any one of (12) to (15),
wherein the device comprises the layer of pattern provided therein as any one of an interlayer insulating layer and a surface protecting film layer or both.

(17) The electronic part according to (16) which is MRAM.

EFFECT OF THE INVENTION

With the positive photosensitive resin composition of the present invention, acid generated from the latent acid generator serves as a catalyst for the dehydration and cyclization reaction of the phenolic hydroxyl group-containing polyamide structure of the polybenzoxazole precursor in the step of heating treatment for the photosensitive resin film that has been exposed and developed. Therefore, the cyclization reaction or curing reaction efficiently proceeds at a lower temperature. The use of the predetermined latent acid generator does not adversely affect the difference of the solubility in a developer (solubility contrast) between the exposed portion and the unexposed portion, achieving excellent sensitivity and resolution. In the method for forming a pattern of the present invention, by using the positive photosensitive resin composition, there can be obtained a pattern which is advantageous not only in excellent sensitivity, resolution and adhesion, but also in excellent heat resistance and low water absorption, whereby a pattern having a favorable form can be obtained even by a low-temperature curing process.

The electronic part of the present invention is advantageous not only in excellent configuration, adhesion and heat resistance, but also in curability in a low-temperature process, whereby the device is prevented from damages, and thus the electronic part has high reliability. Because of low damages on the device, the electronic part can be produced with a high yield.

BEST MODE FOR CARRYING OUT THE INVENTION

Figure 1:
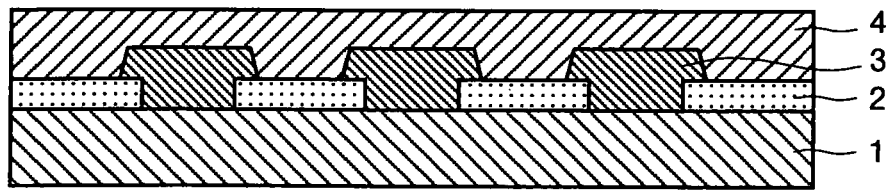
FIG. 1 is a cross-sectional view of a step in the fabrication process for a semiconductor device having a multilayer wiring structure.

Embodiments of the present invention will be explained hereinbelow.

The positive photosensitive resin composition of the present invention comprises, as a component (a), alkaline aqueous solution-soluble polyamide having a polyoxazole precursor structure. As to the polyamide used in the present invention, there is no particular limitation as long as it has a polyoxazole precursor structure therein and it is alkaline aqueous solution-soluble. For example, it may have a structure of polyamide other than the polyoxazole precursor, a polybenzoxazole structure, and a precursor for a polyimide or polyimide structure (polyamide acid or polyamide acid ester), together with the polyoxazole precursor structure.

A preferred example of the polyamide to be used in the present invention may be a phenolic hydroxyl group-containing polyamide having a repeating unit represented by the general formula (I) above and being alkaline aqueous solution-soluble. The phenolic hydroxyl group-containing polyamide generally functions as a polyoxazole precursor, preferably a polybenzoxazole precursor. The alkaline aqueous solution refers to an alkaline solution of, e.g., tetramethylammonium hydroxide, a metal hydroxide, and an organic amine. A polyoxazole precursor structure such as the hydroxyl group-containing amide unit represented by the general formula (I) is subjected to a ring-closing dehydration upon curing and eventually converted into oxazole having excellent heat resistance and mechanical properties as well as excellent electrical properties.

The polyamide used in the present invention preferably has the repeating unit represented by the general formula (I) above. It is further preferred that the polyamide contains a certain amount or more of the OH group-containing amide units, since the solubility of the polyamide in an alkaline aqueous solution is ascribed to an OH group (usually a phenolic hydroxyl group) bonded to the group U.

Specifically, the polyamide is preferably a polyamide represented by the following general formula (IV):

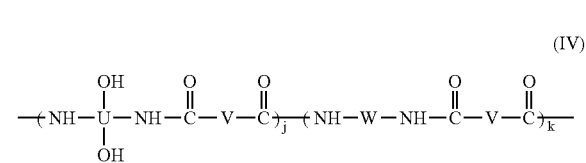

wherein U represents a tetravalent organic group; each of V and W represents a divalent organic group; and each of j and k represents a molar fraction wherein the sum of j and k is 100 mol %, j is 60 to 100 mol %, and k is 40 to 0 mol %. In the formula, it is more preferred that molar fractions j and k are 80 to 100 mol % and 20 to 0 mol %, respectively.

The component (a) preferably has a molecular weight of 3,000 to 200,000, and more preferably 5,000 to 100,000, in terms of weight average molecular weight. The molecular weight referred to herein is a value measured by gel permeation chromatography using a calibration curve obtained with polystyrene standard samples.

There is no particular limitation as to the method for preparing the polyamide for use in the present invention. For example, the polyamide having the repeating unit represented by the general formula (I) above can usually be synthesized from a dicarboxylic acid derivative and a hydroxyl group-containing diamine. Specifically, the polyamide may be synthesized by converting a dicarboxylic acid derivative to a dihalide derivative and then reacting the dihalide derivative with the diamine. As the dihalide derivative, preferred is a dichloride derivative.

The dichloride derivative may be synthesized by reacting a dicarboxylic acid derivative with a halogenating agent. Examples of the halogenating agent for use may include those usually used in acid chlorination of a carboxylic acid, such as thionyl chloride, phosphoryl chloride, phosphorus oxychloride, and phosphorus pentachloride.

Examples of methods for synthesizing a dichloride derivative may include a method in which a dicarboxylic acid derivative and a halogenating agent are reacted with each other in a solvent, and a method in which the reaction is conducted in an excess amount of halogenating agent and then the excess halogenating agent is distilled off. As the reaction solvent, for example, N-methyl-2-pyrrolidone, N-methyl-2-pyridone, N,N-dimethylacetamide, N,N-dimethylformamide, toluene, or benzene may be used.

When the reaction is conducted in a solvent, the amount of the halogenating agent to be used is preferably 1.5 to 3.0 mol, and more preferably 1.7 to 2.5 mol, relative to the dicarboxylic acid derivative. When the reaction is conducted in the halogenating agent, the amount of the halogenating agent used is preferably 4.0 to 50 mol, and more preferably 5.0 to 20 mol. The reaction temperature is preferably −10 to 70° C., and more preferably 0 to 20° C.

It is preferred that the reaction of the dichloride derivative and diamine is conducted in an organic solvent in the presence of a dehydrohalogenating agent. As the dehydrohalogenating agent, an organic base, such as pyridine or triethylamine, is usually used. As the organic solvent, for example, N-methyl-2-pyrrolidone, N-methyl-2-pyridone, N,N-dimethylacetamide, or N,N-dimethylformamide may be used. The reaction temperature is preferably −10 to 30° C., and more preferably 0 to 20° C.

In the general formula (I), the tetravalent organic group represented by the group U is usually a residue derived from dihydroxydiamine which reacts with dicarboxylic acid to form a polyamide structure, and is preferably a tetravalent aromatic group. The organic group is preferably a group having 6 to 40 carbon atoms, and more preferably a tetravalent aromatic group having 6 to 40 carbon atoms. The tetravalent aromatic group is preferably a residue of diamine having a structure in which all of the four bonding sites are present on the aromatic ring and two hydroxyl groups are positioned at ortho-position of each amine.

Examples of the diamines may include 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, and 2,2-bis(4-amino-3-hydroxyphenyl)-1,1,1,3,3,3-hexafluoropropane, although not limited thereto. These compounds may be used individually or in combination.

In the aforementioned formula of the polyamide, the divalent organic group represented by the group W is usually a residue derived from diamine (excluding the dihydroxydiamine which forms the group U) which reacts with dicarboxylic acid to form a polyamide structure, and is preferably a divalent aromatic group or aliphatic group. The organic group is preferably a group having 4 to 40 carbon atoms, and more preferably a divalent aromatic group having 4 to 40 carbon atoms.

Examples of the diamines may include aromatic diamine compounds, such as 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis(4-(4-aminophenoxy)phenyl)ether, and 1,4-bis(4-aminophenoxy)benzene, and diamines having a silicone group, such as LP-7100, X-22-161AS, X-22-161A, X-22-161B, X-22-161C, and X-22-161E (trade names; each manufactured by Shin-Etsu Chemical Co., Ltd.), although not limited thereto. These compounds may be used individually or in combination.

In the general formula (I), the divalent organic group represented by the group V is a residue derived from dicarboxylic acid which reacts with diamine to form a polyamide structure, and is preferably a divalent aromatic group. The organic group is preferably a group having 6 to 40 carbon atoms, and more preferably a divalent aromatic group having 6 to 40 carbon atoms. The divalent aromatic group preferably has a structure in which all of the two bonding sites are present on the aromatic ring.

Examples of the dicarboxylic acids may include aromatic dicarboxylic acids, such as isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenyl ether, 4,4'-dicarboxytetraphenylsilane, bis(4-carboxyphenyl) sulfone, 2,2-bis(p-carboxyphenyl)propane, 5-tert-butylisophthalic acid, 5-bromoisophthalic acid, 5-fluoroisophthalic acid, 5-chloroisophthalic acid, and 2,6-naphthalenedicarboxylic acid; and aliphatic dicarboxylic acids, such as 1,2-cyclobutanedicarboxylic acid, 1,4-cyclohexanedicarboxylic acid, 1,3-cyclopentanedicarboxylic acid, oxalic acid, malonic acid, and succinic acid, although not limited thereto. These compounds may be used individually or in combination.

As mentioned above, the component (a), i.e. polyamide in the present invention, may be a polyoxazole precursor having a polyimide precursor structure. A specific example thereof may be a polyamide having a repeating unit represented by the following general formula (VI):

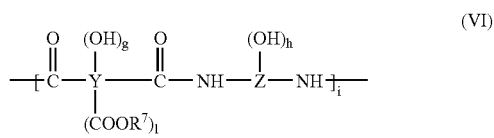

wherein Y represents a di- to octavalent organic group having at least two carbon atoms; Z represents a di- to hexavalent organic group having at least two carbon atoms; R⁷ represents hydrogen or an organic group having 1 to 20 carbon atoms; l is an integer of 0 to 2; each of g and h is an integer of 0 to 4; and i is the number of the repeating units, preferably an integer of 10 to 100,000, with the proviso that l in at least part of the repeating units is 1 or 2, and that the sum of g and h in at least part of the repeating units is equal to or more than 1.

Examples of preferred structures of Y and Z may be those shown below. In each structure of Y or Z, the bonding site to another atom is present on the aromatic ring.

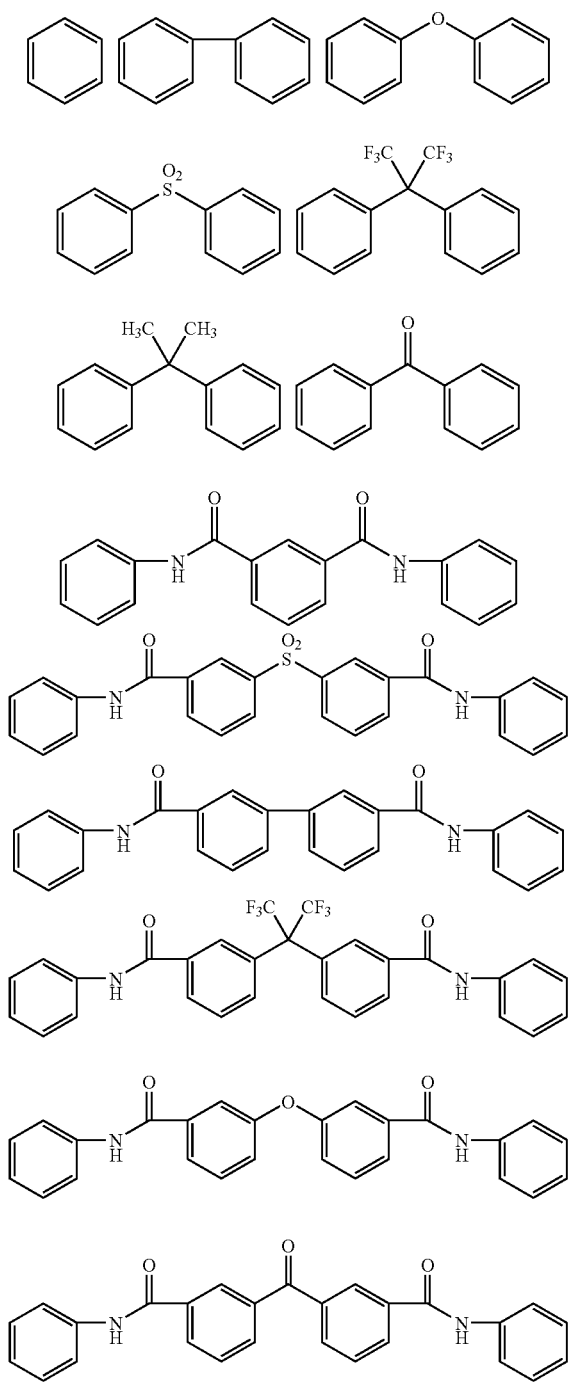

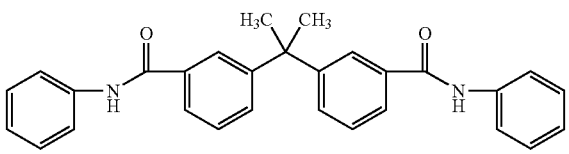

In the above structures, the bonding site of each of Y and Z to another atom is usually present on the aromatic ring. It is preferred that bonding sites to an amide group and a carboxyl group are present on the aromatic ring at the end of each structure. In the structure in which X and Y have an amide linkage, it is preferred that a hydroxyl group (OH) is present on the aromatic ring to which a nitrogen atom is bonded, and positioned at ortho-position of the nitrogen atom, so that the structure can form a benzoxazole ring at the later stage of reaction.

Preferred examples of R⁷'s may include a hydrogen atom, a methyl group, an ethyl group, an isopropyl group, a t-butyl group, a n-butyl group, a cyclohexyl group, a phenyl group, a p-hydroxybenzyl group, and a tetrahydropyranyl group.

With respect to the method for preparing the polyoxazole precursor having a polyimide precursor structure, there is no particular limitation. However, it is preferred that a polyimide precursor is prepared using, for example, as diamine and/or tetracarboxylic dianhydride which are materials for a polyimide precursor, diamine and/or tetracarboxylic dianhydride having in their structures a structure capable of forming an oxazole ring (hereinafter, they may be referred to, respectively, as "diamine (i)" and "tetracarboxylic dianhydride (ii)").

As examples of diamine (i) and tetracarboxylic dianhydride (ii), there can be mentioned the following compounds.

Diamine (i)

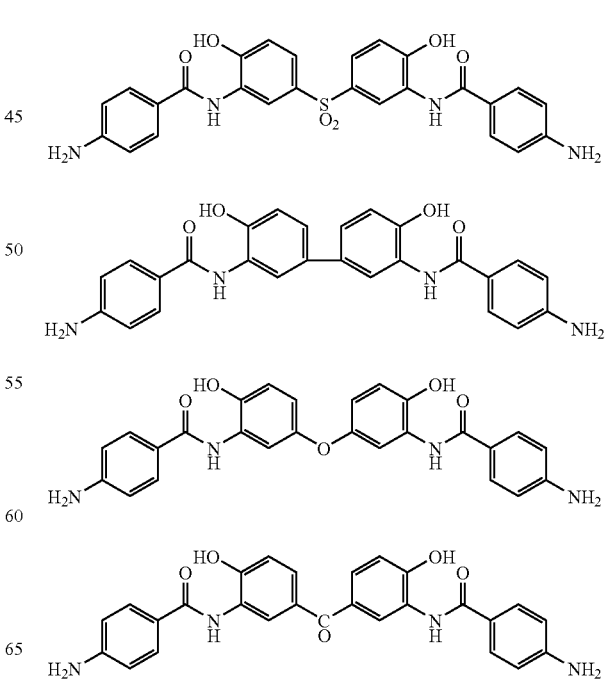

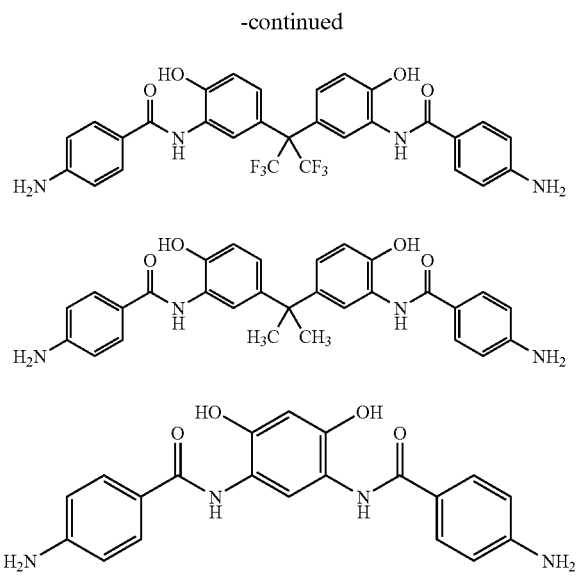

Tetracarboxylic dianhydride (ii)

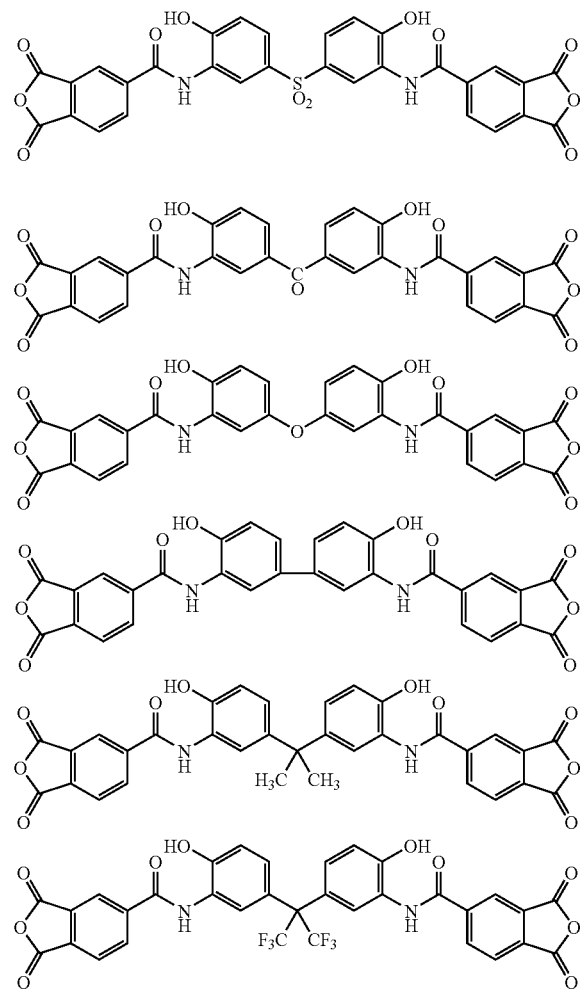

Examples of diamines to be used in combination with tetracarboxylic dianhydride (ii) may include diamine (i) and the diamines mentioned above in connection with U or W in the general formula (I) above. Examples of tetracarboxylic dianhydrides to be used in combination with diamine (i) may include tetracarboxylic dianhydride (ii), and pyromellitic dianhydride, biphenyltetracarboxylic dianhydride, benzophenone tetracarboxylic dianhydride, and oxydiphthalic dianhydride.

The component (b), i.e., an o-quinonediazide compound used in the present invention is a sensitizer, which generates carboxylic acid upon irradiation with light and increases the solubility of the irradiated portion of the composition in an alkaline aqueous solution. Such an o-quinonediazide compound may be obtained by, for example, subjecting an o-quinonediazidosulfonyl chloride to condensation reaction in the presence of a dehydrochlorinating agent with another compound such as a hydroxy compound and an amino compound. Examples of the o-quinonediazidosulfonyl chlorides may include benzoquinone-1,2-diazido-4-sulfonyl chloride, naphthoquinone-1,2-diazido-5-sulfonyl chloride, and naphthoquinone-1,2-diazido-4-sulfonyl chloride.

Examples of the hydroxy compound may include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, and tris(4-hydroxyphenyl)ethane.

Examples of amino compounds may include p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

It is preferred that the o-quinonediazidosulfonyl chloride and the hydroxy compound and/or the amino compound are incorporated so that the sum of the hydroxyl group and the amino group becomes 0.5 to 1 equivalent amount, relative to 1 mol of o-quinonediazidosulfonyl chloride. A preferred dehydrochlorinating agent/o-quinonediazidosulfonyl chloride ratio is in the range of from 0.95/1 to 1/0.95. The reaction temperature is preferably 0 to 40° C., and the reaction time is preferably 1 to 10 hours.

A solvent for the reaction may be dioxane, acetone, methyl ethyl ketone, tetrahydrofuran, diethyl ether, or N-methylpyrrolidone. Examples of dehydrochlorinating agents may include sodium carbonate, sodium hydroxide, sodium hydrogencarbonate, potassium carbonate, potassium hydroxide, trimethylamine, triethylamine, and pyridine.

In the positive photosensitive resin composition of the present invention, the amount of the component (b) incorporated is preferably 5 to 100 parts by weight, more preferably 8 to 40 parts by weight, relative to 100 parts by weight of the component (a), from the viewpoint of achieving appropriate solubility difference between the exposed portion and the unexposed portion and from the viewpoint of acceptable range of the sensitivity.

The component (c) used in the present invention is a latent acid generator which generates acid upon heating. The latent acid generator in the present invention preferably has a heat decomposition starting temperature of 50 to 270° C. Specifically, the latent acid generator preferably has a 1% weight reduction temperature of 50 to 270° C. or a 5% weight reduction temperature of 60 to 300° C., as measured by thermogravimetric analysis (TG). The latent acid generator more preferably has a heat decomposition starting temperature of 140 to 250° C. since such an acid generator generates no acid during the prebake and hence it does not adversely affect the light-sensitivity properties. Specifically, the latent acid generator preferably has a 1% weight reduction temperature of 140 to 250° C. or a 5% weight reduction temperature of 170 to 265° C., as measured by thermogravimetric analysis (TG).

Acid generated from the latent acid generator is preferably strong acid. Preferable examples thereof may include arylsulfonic acid, such as p-toluenesulfonic acid or benzenesulfonic acid; perfluoroalkylsulfonic acid, such as camphorsulfonic acid, trifluoromethanesulfonic acid, or nonafluorobutanesulfonic acid; or alkylsulfonic acid, such as methanesulfonic acid, ethanesulfonic acid, or butanesulfonic acid. The above acid efficiently functions as a catalyst for the dehydration reaction and cyclization of a phenolic hydroxyl group-containing polyamide structure of the polybenzoxazole precursor. In contrast, an acid generator that generates hydrochloric acid, bromic acid, iodic acid, or nitric acid, which has weak acidity and easily volatilizes by heating, is considered to have almost no effect on the cyclodehydration reaction of the polybenzoxazole precursor, making it difficult to satisfactorily obtain the effect of the present invention.

The acid is added to the positive photosensitive resin composition of the present invention as a latent acid generator in the form of an onium salt or a covalent bond in, e.g., imide sulfonate.

Preferred examples of the onium salts may include diaryliodonium salts, such as a diphenyliodonium salt; di(alkylaryl) iodonium salts, such as a di(t-butylphenyl)iodonium salt; trialkylsulfonium salts, such as a trimethylsulfonium salt; dialkylmonoarylsulfonium salts, such as a dimethylphenylsulfonium salt; and diarylmonoalkylsulfonium salts, such as a diphenylmethylsulfonium salt. These salts have a decomposition starting temperature in the range of from 150 to 250° C., and hence efficiently decompose in the cyclodehydration reaction of a polybenzoxazole precursor at a temperature equal to or lower than 280° C. In contrast, a triphenylsulfonium salt is not preferred as a latent acid generator in the present invention. A triphenylsulfonium salt has high thermal stability and generally has a decomposition temperature higher than 300° C., and therefore it does not decompose in the cyclodehydration reaction of a polybenzoxazole precursor at a temperature equal to or lower than 280° C., which indicates that the triphenylsulfonium salt does not satisfactorily function as a catalyst for the cyclodehydration.

From the above point of view, as the onium salt which serves as the latent acid generator, preferred is, for example, a diaryliodonium salt, a di(alkylaryl)iodonium salt, a trialkylsulfonium salt, a dialkylmonoarylsulfonium salt, or a diarylmonoalkylsulfonium salt of arylsulfonic acid, camphorsulfonic acid, perfluoroalkylsulfonic acid, or alkylsulfonic acid. Specifically, as preferred examples, there may be mentioned di(t-butylphenyl)iodonium paratoluenesulfonate (1% weight reduction temperature: 180° C.; 5% weight reduction temperature: 185° C.), di(t-butylphenyl)iodonium trifluoromethanesulfonate (1% weight reduction temperature: 151° C.; 5% weight reduction temperature: 173° C.), trimethylsulfonium trifluoromethanesulfonate (1% weight reduction temperature: 255° C.; 5% weight reduction temperature: 278° C.), dimethylphenylsulfonium trifluoromethanesulfonate (1% weight reduction temperature: 186° C.; 5% weight reduction temperature: 214° C.), diphenylmethylsulfonium trifluoromethanesulfonate (1% weight reduction temperature: 154° C.; 5% weight reduction temperature: 179° C.), di(t-butylphenyl)iodonium nonafluorobutanesulfonate, diphenyliodonium camphorsulfonate, diphenyliodonium ethanesulfonate, dimethylphenylsulfonium benzenesulfonate, and diphenylmethylsulfonium toluenesulfonate.

As imide sulfonate, naphthoylimide sulfonate is desired. In contrast, phthalimide sulfonate has poor thermal stability and generates acid before the curing reaction, lowering the storage stability and thus not being preferable. Specific preferred examples of naphthoylimide sulfonate may include 1,8-naphthoylimide trifluoromethylsulfonate (1% weight reduction temperature: 189° C.; 5% weight reduction temperature: 227° C.) and 2,3-naphthoylimide trifluoromethylsulfonate (1% weight reduction temperature: 185° C.; 5% weight reduction temperature: 216° C.)

As the component (c), a compound having an $R^1R^2C=N-O-SO_2-R$ structure, such as the one represented by the chemical formula given below (1% weight reduction temperature: 204° C.; 5% weight reduction temperature: 235° C.), may be used. Examples of R herein may include aryl groups, such as a p-methylphenyl group and a phenyl group; alkyl groups, such as a methyl group, an ethyl group, and an isopropyl group; and perfluoroalkyl groups, such as a trifluoromethyl group and a nonafluorobutyl group. Examples of $R^1$ may include a cyano group, and examples of $R^2$ may include a methoxyphenyl group and a phenyl group.

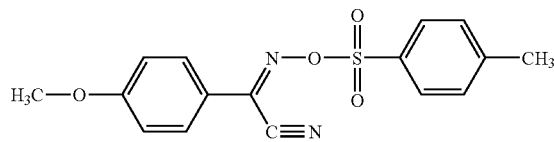

As the component (c), a compound having an amide structure $-HN-SO_2-R$, such as the one represented by the chemical formula given below (1% weight reduction temperature: 104° C.; 5% weight reduction temperature: 270° C.), may be used. Examples of R herein may include alkyl groups, such as a methyl group, an ethyl group, and a propyl group; aryl groups, such as a methylphenyl group and a phenyl group; and perfluoroalkyl groups, such as a trifluoromethyl group and a nonafluorobutyl group. Examples of groups to which $-HN-SO_2-R$ is bonded may include 2,2'-bis(4-hydroxyphenyl)hexafluoropropane, 2,2'-bis(4-hydroxyphenyl)propane, and di(4-hydroxyphenyl)ether.

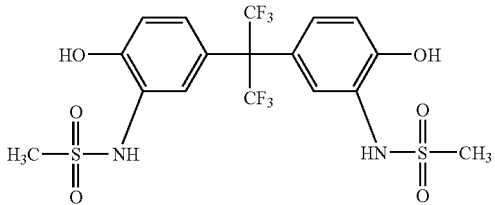

As the component (c) in the present invention, there may be used a salt formed from a strong acid and a base, which salt is not involved in onium salts. As the strong acid, preferred is, for example, arylsulfonic acid, such as p-toluenesulfonic acid or benzenesulfonic acid; perfluoroalkylsulfonic acid, such as camphorsulfonic acid, trifluoromethanesulfonic acid, or nonafluorobutanesulfonic acid; or alkylsulfonic acid, such as methanesulfonic acid, ethanesulfonic acid, or butanesulfonic acid. As the base, preferred is, for example, alkylpyridine, such as pyridine or 2,4,6-trimethylpyridine; N-alkylpyridine, such as 2-chloro-N-methylpyridine; or halogenated N-alkylpyridine. More specifically, as preferred examples, there may be mentioned
pyridine p-toluenesulfonate (1% weight reduction temperature: 147° C.; 5% weight reduction temperature: 190° C.), a salt composed of dibenzyl L-aspartate and p-toluenesulfonic acid (1% weight reduction temperature: 202° C.; 5% weight reduction temperature: 218° C.), 2,4,6-trimethylpyridine p-toluenesulfonate, and 1,4-dimethylpyridine p-toluenesulfonate. These compounds may decompose in the cyclodehydration reaction of a polybenzoxazole precursor at a temperature equal to or lower than 280° C. and may function as a catalyst.

The amount of the component (c) incorporated is preferably 0.1 to 30 parts by weight, more preferably 0.2 to 20 parts by weight, further preferably 0.5 to 10 parts by weight, relative to 100 parts by weight of the component (a).

When the component (d), i.e., a compound having a phenolic hydroxyl group optionally used in the present invention is added to the composition, the solubility of the exposed portion may be increased in the development with an alkaline aqueous solution, thus improving the sensitivity. Further, upon curing a film having a pattern formed, the film may be prevented from melting. With respect to the compound having a phenolic hydroxyl group to be used in the present invention, there is no particular limitation. However, when a compound having too large a molecular weight is used, the dissolution promotion effect for the exposed portion is lowered and therefore, generally, the compound preferably has a molecular weight equal to or less than 1,500. Especially preferred is a compound of the general formula (II) below, which has a good balance between the dissolution promotion effect for the exposed portion and the effect of preventing the film being cured from melting.

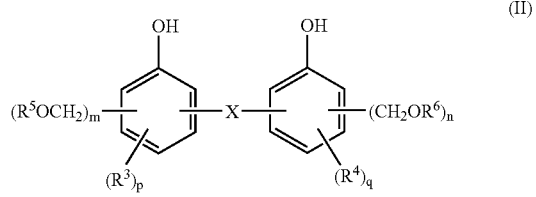

(II)

wherein X represents a single bond or a divalent organic group, each of $R^3$ to $R^6$ independently represents a hydrogen atom or a monovalent organic group, each of m and n is independently an integer of 1 to 3, and each of p and q is independently an integer of 0 to 4.

Examples of divalent groups represented by X in the general formula (II) above may include alkylene groups having 1 to 10 carbon atoms, such as a methylene group, an ethylene group, and a propylene group; alkylidene groups having 2 to 10 carbon atoms, such as an ethylidene group; arylene groups having 6 to 30 carbon atoms, such as a phenylene group; a group obtained by replacing part of or all of the hydrogen atoms in the above hydrocarbon group by a halogen atom or halogen atoms, such as a fluorine atom; a sulfonic group; a carbonyl group; an ether linkage; a thioether linkage; and an amide linkage, and preferred examples may include divalent organic groups represented by the following general formula (V):

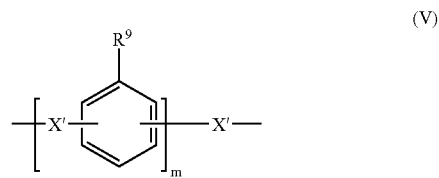

(V)

wherein each X' is independently selected from a single bond, an alkylene group (having, for example, 1 to 10 carbon atoms), an alkylidene group (having, for example, 2 to 10 carbon atoms), a group obtained by replacing part of or all of the hydrogen atoms in the above group by a halogen atom or halogen atoms, a sulfonic group, a carbonyl group, an ether linkage, a thioether linkage, and an amide linkage; $R^9$ is a hydrogen atom, a hydroxyl group, an alkyl group, or a haloalkyl group, and, when a plurality of $R^9$'s are present, they may be the same or different; and m is 1 to 10.

Further preferred examples may include a compound of the general formula (II) above wherein the group represented by X is the following general formula (III):

(III)

wherein each of two A's independently represents a hydrogen atom or an alkyl group having 1 to 10 carbon atoms, and optionally has any one of an oxygen atom and a fluorine atom or both, since the compound has more preferable effect.

In the positive photosensitive resin composition of the present invention, the amount of the component (d) incorporated is preferably 1 to 30 parts by weight, more preferably 3 to 25 parts by weight, relative to 100 parts by weight of the component (a), from the viewpoint of acceptable range of the development time and the unexposed portion residual ratio.

The positive photosensitive resin composition of the present invention may comprise a solvent as an optional component. Examples of solvents usually used may include γ-butyrolactone, ethyl lactate, propylene glycol monomethyl ether acetate, benzyl acetate, n-butyl acetate, ethoxyethyl propionate, methyl 3-methoxypropionate, N-methyl-2-pyrrolidone, N,N-dimethylformamide, N,N-dimethylacetamide, dimethyl sulfoxide, hexamethyl phophorylamide, tetramethylene sulfone, diethyl ketone, diisobutyl ketone, and methyl amyl ketone.

These solvents may be used individually or in combination. With respect to the amount of the solvent used, there is no particular limitation. However, generally, the amount is preferably controlled so that the content of the solvent in the composition becomes 20 to 90% by weight.

In the positive photosensitive resin composition of the present invention, a compound for inhibiting dissolution of the component (a) in an alkaline aqueous solution may be further added. Specific examples of compounds for inhibiting dissolution of the component (a) may include diphenyliodonium nitrate, bis(p-tert-butylphenyl)iodonium nitrate, diphenyliodonium bromide, diphenyliodonium chloride, and diphenyliodonium iodide.

The above compounds generate acid which easily volatilizes, and hence have no effect on the cyclodehydration reaction of a polybenzoxazole precursor. However, they effectively inhibit the dissolution and contribute to controlling of the thickness of the residual film or development time. From the viewpoint of acceptable range of the sensitivity and the development time, the amount of the component incorporated is preferably 0.01 to 15 parts by weight, more preferably 0.01 to 10 parts by weight, further preferably 0.05 to 3 parts by weight, relative to 100 parts by weight of the component (a).

The positive photosensitive resin composition of the present invention may contain an organosilane compound or an aluminum chelate compound for improving the adhesion of a cured film to a substrate. Examples of organosilane compounds may include vinyltriethoxysilane, γ-glycidoxypropyltriethoxysilane, γ-methacryloxypropyltrimethoxysilane, ureidopropyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene. Examples of aluminum chelate compounds may include tris(acetylacetonato)aluminum and acetyl acetate aluminum diisopropylate. When the adhesion improving agent is used, the amount of the agent incorporated is preferably 0.1 to 20 parts by weight, more preferably 0.5 to 10 parts by weight, relative to 100 parts by weight of the component (a).

In the positive photosensitive resin composition of the present invention, for improving the spreadability, for example, preventing striation (unevenness of thickness), or improving the development properties, an appropriate surfactant or leveling agent may be added. Examples of the surfactants or leveling agents may include polyoxyethylene lauryl ether, polyoxyethylene stearyl ether, polyoxyethylene oleyl ether, and polyoxyethylene octylphenol ether, and examples of commercially available products may include Megaface F171, F173, and R-08 (trade names; manufactured by Dainippon Ink & Chemicals Incorporated), Fluorad FC430, FC431 (trade names; manufactured by Sumitomo 3M), and organosiloxane polymers KP341, KBM303, KBM403, and KBM803 (trade names; manufactured by Shin-Etsu Chemical Co., Ltd.).

With the positive photosensitive resin composition of the present invention, a pattern of polyoxazole may be formed through a step of applying the composition onto a supporting substrate and drying the composition, a step of exposing the resultant film to a predetermined pattern, a step of developing the film, and an optional step of subjecting the film to heating treatment. In the step of applying the composition onto a supporting substrate and drying the composition, the photosensitive resin composition of the present invention is applied onto a supporting substrate, such as a glass substrate, a semiconductor, a metal oxide insulator (e.g., $TiO_2$ or $SiO_2$), or silicon nitride, by spin coating using, e.g., a spinner, and then the applied composition is dried using a hotplate or an oven.

In the subsequent exposure step, the coating film formed of the photosensitive resin composition on the supporting substrate is irradiated through a mask with a ray of active light, such as ultraviolet light, visible light, or radiation. In the development step, the exposed portion is removed using a developer to obtain a pattern. Preferred examples of developers may include alkaline aqueous solutions of sodium hydroxide, potassium hydroxide, sodium silicate, ammonia, ethylamine, diethylamine, triethylamine, triethanolamine, or tetramethylammonium hydroxide. The aqueous solution preferably has a base concentration of 0.1 to 10% by weight. The developer may contain an alcohol or a surfactant. It may be added preferably in an amount of 0.01 to 10 parts by weight, more preferably 0.1 to 5 parts by weight, relative to 100 parts by weight of the developer.

In the subsequent heating treatment step, the pattern obtained is preferably subjected to heating treatment at a temperature equal to or lower than 280° C., more preferably 150 to 280° C. to form a pattern of heat-resistant polyoxazole having an oxazole ring and another functional group. In the heating treatment step, a more preferred temperature of the heating treatment is 220 to 260° C. It is preferred that the heating treatment is conducted in nitrogen atmosphere, which may prevent the photosensitive resin composition film from oxidation. In the above temperature range, the cyclodehydration reaction efficiently proceeds with minimum damages on the substrate and the device. Therefore, by using the method for forming a pattern of the present invention, a device can be produced in high yield. In addition, this leads to savings on energy consumed in the process.

In the heating treatment in the present invention, an ordinary oven filled with nitrogen, or a microwave curing apparatus or a variable frequency microwave curing apparatus may be used. By using such apparatus, only the photosensitive resin composition film may be effectively heated while maintaining the temperature of the substrate or device at, for example, a temperature equal to or lower than 250° C.

Studies on the ring-closing dehydration of a polyimide precursor using microwaves are disclosed in, for example, JP-2587148 B and JP-3031434 B. Further, U.S. Pat. No. 5,738,915 has proposed a method in which, in the ring-closing dehydration of a polyimide precursor thin film using microwaves, the film is irradiated with microwaves while changing the frequency in a short cycle to prevent the polyimide thin film or substrate from damages.

When the film is irradiated with a pulse of microwave while changing the frequency, standing waves can be avoided, so that the surface of the substrate can be advantageously heated uniformly. When a substrate comprising a metal wiring in the electronic part (mentioned below) is irradiated with a pulse of microwave while changing the frequency, the occurrence of, e.g., electric discharge from a metal can be prevented, so that the electronic part can be advantageously protected from breakage due to, e.g., electric discharge.

The frequency of the microwave to be employed for the ring-closing dehydration of the polyamide in the positive photosensitive resin composition of the present invention may be in the range of from 0.5 to 20 GHz. In this range, from a practical point of view, the frequency is preferably in the range of from 1 to 10 GHz, more preferably 2 to 9 GHz.

It is desired that the frequency of the microwave for irradiation is continuously changed, but the frequency may actually be changed stepwise. Upon such a stepwise frequency changing, the irradiation time of the microwave of a certain frequency is preferably as short as possible, for minimizing the standing wave and the electric discharge from the metal. The irradiation time of a microwave of single frequency is preferably 1 msec. or less, especially preferably 100 μsec. or less.

The power of the microwave for irradiation may vary depending on the size of the apparatus to be used or the amount of the material to be heated, but the power is generally in the range of from 10 to 2,000 W. In this range, from a practical point of view, the power is preferably 100 to 1,000 W, more preferably 100 to 700 W, most preferably 100 to 500 W. When the power is 10 W or less, it may be difficult to heat a material in a short time, and, when the power is 2,000 W or more, too-rapid temperature elevation is likely to occur.

The ring-closing dehydration of the polyamide in the positive photosensitive resin composition of the present invention is preferably performed at a low temperature as mentioned above for preventing the polyoxazole thin film or substrate from damages during the ring-closing dehydration. In the present invention, the temperature for ring-closing dehydration of the polyamide in the positive photosensitive resin composition is preferably equal to or lower than 280° C., more preferably equal to or lower than 250° C., most preferably equal to or lower than 210° C. The temperature of the substrate may be measured by a known method such as those using infrared or a thermocouple of, e.g., GaAs.

It is preferred that the microwave used in the ring-closing dehydration of the polyamide in the positive photosensitive resin composition of the present invention is irradiated as a pulse form by repeating "on/off" operations. Such an irradiation of the microwave in the pulse form may achieve stable heating at an adjusted temperature, thus making it possible to prevent the polyoxazole thin film or substrate from damages. The time of one pulse of microwave for irradiation may vary depending on the conditions, but the time is generally 10 sec. or shorter.

The time of the ring-closing dehydration of the polyamide in the positive photosensitive resin composition of the present invention refers to a period of time until the ring-closing dehydration reaction satisfactorily proceeds. Preferably, the time is generally 5 hours or less from the viewpoint of achieving appropriate operation efficiency. The atmosphere for the ring-closing dehydration may be selected from air and an inert atmosphere of, e.g., nitrogen.

Thus, irradiation of the substrate having a layer of the positive photosensitive resin composition of the present invention with a microwave under the above-mentioned conditions results in ring-closing dehydration of the polyamide contained in the positive photosensitive resin composition of the present invention. The polyoxazole thin film obtainable by this ring-closing dehydration at a low temperature using the microwave will have physical properties comparable with those of the film obtained by a ring-closing dehydration process at a high temperature using a heat diffusion oven.

The positive photosensitive resin composition of the present invention may be used in an electronic part, such as a semiconductor device or a multilayer wiring board, and specifically may be used for forming a surface protecting film or interlayer insulating layer in a semiconductor device, or forming an interlayer insulating layer in a multilayer wiring board. As to the semiconductor device in the present invention, there is no particular limitation as long as it has the surface protecting film or interlayer insulating layer formed using the aforementioned composition, and may have a variety of structures.

Figure 2:
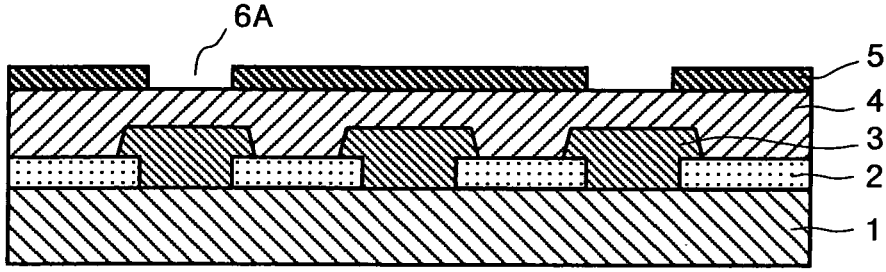
FIG. 2 is a cross-sectional view of a step in the fabrication process subsequent to the step shown in FIG. 1.
Figure 3:
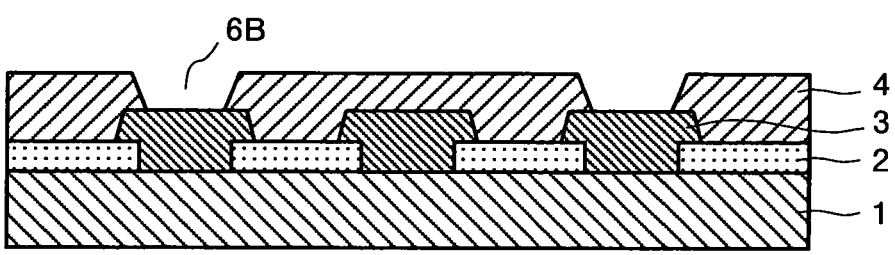
FIG. 3 is a cross-sectional view of a step in the fabrication process subsequent to the step shown in FIG. 2.
Figure 4:
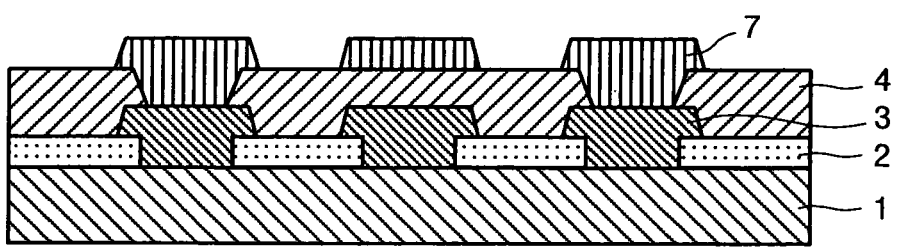
FIG. 4 is a cross-sectional view of a step in the fabrication process subsequent to the step shown in FIG. 3.
Figure 5:
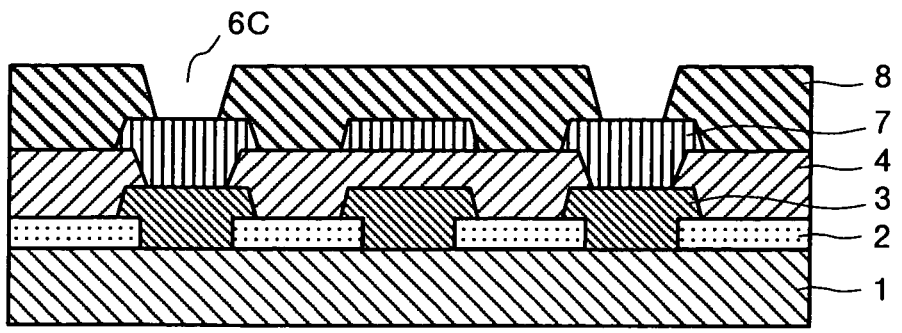
FIG. 5 is a cross-sectional view of a step in the fabrication process subsequent to the step shown in FIG. 4.

One example of a fabrication process for the semiconductor device in the present invention will be described below. FIGS. 1 to 5 are views of the fabrication process for a semiconductor device having a multilayer wiring structure. FIGS. 1 to 5 are a series of the first through fifth steps, respectively. In FIGS. 1 to 5, semiconductor substrate 1 composed of, e.g., a Si substrate having a circuit element is covered with protective film 2 composed of, e.g., a silicon oxide film, leaving a predetermined portion of the circuit element uncovered. First conductor layer 3 is formed on the uncovered part of the circuit element. Film 4 composed of, e.g., a polyimide resin is formed as an interlayer insulating layer on the semiconductor substrate by, for example, a spin coating process (first step).

Photosensitive resin layer 5 composed of, e.g., chlorinated rubber or phenolic novolak is then formed on interlayer insulating layer 4 by a spin coating process, and windows 6A are formed by a known photolithography technique so that predetermined portions of interlayer insulating layer 4 are uncovered (second step). Interlayer insulating layer 4 within windows 6A is selectively etched by a dry etching method using gas of oxygen or carbon tetrafluoride, to form windows 6B. Photosensitive resin layer 5 is then completely removed using an etching solution such that first conductor layer 3 within windows 6B is not etched but photosensitive resin layer 5 is selectively etched (third step).

Second conductor layer 7 is then formed using a known photolithography technique to achieve complete electrical connection with first conductor layer 3 (fourth step). If a multilayer wiring structure composed of three or more layers is desired, the aforementioned series of steps may be repeated for forming each layer.

Surface protecting film 8 is subsequently formed. In this example of FIGS. 1 to 5, the surface protecting film is formed using the aforementioned photosensitive resin composition. The photosensitive resin composition is first applied by a spin coating process and dried, and irradiated with light through a mask having a pattern for forming windows 6C at predetermined positions. The resultant film is then developed using an alkaline aqueous solution to form a pattern. The film is then subjected to heating treatment, to obtain surface protecting film layer (polybenzoxazole film) 8 (fifth step). Surface protecting film layer (polybenzoxazole film) 8 protects the conductor layer from an external stress or α-ray, and thus the resultant semiconductor device has excellent reliability. The photosensitive resin film that has exposed to the light may be heated prior to the development (PEB).

In the present invention, the step of heating treatment for curing the polyoxazole film may be performed at a temperature equal to or lower than 280° C., which conventionally needs to be 300° C. or higher. The photosensitive resin composition of the present invention satisfactorily undergoes a cyclodehydration reaction in the curing even at a temperature equal to or lower than 280° C. Therefore the resultant film has physical properties (e.g., elongation, water absorption, weight reduction temperature, and outgas) comparable with those of the film cured at 300° C. or higher. The temperature for the process can be lowered and hence a defect of the device due to heat can be reduced, whereby a semiconductor device having excellent reliability can be obtained with a high yield.

In the above example, the interlayer insulating layer may also be formed using the photosensitive resin composition of the present invention.

As a preferred example of an electronic part comprising an electronic device having a surface protecting film or interlayer insulating layer obtained using the photosensitive resin composition of the present invention, there can be mentioned an MRAM having a low heat resistance. That is, the photosensitive resin composition of the present invention is advantageously used as a surface protecting film for MRAM.

In addition to the MRAM, a polymer memory (polymer ferroelectric RAM (PFRAM)) or a phase change memory (phase change RAM (PCRAM) or ovonics unified memory (OUM)), which are promising memories of next generation, may also employ therein a new material having a low heat resistance, as compared to a conventional memory. Thus, the photosensitive resin composition of the present invention is also preferable as a surface protecting film for such devices.

EXAMPLES

The present invention will be explained in further detail with reference to the following Examples. Note that the present invention is not limited by the Examples.

Examples 1 to 14

Synthesis Example 1 Synthesis of Polybenzoxazole Precursor 15.48 g of 4,4'-diphenyl ether dicarboxylic acid and 90 g of N-methylpyrrolidone were changed into a 0.5-liter flask having a stirrer and a thermometer. The flask was cooled to 5° C., and 12.64 g of thionyl chloride was then added dropwise thereto. Reaction was performed for 30 minutes for obtaining a solution of 4,4'-diphenyl ether dicarboxylic acid chloride. Separately, 87.5 g of N-methylpyrrolidone was changed into a 0.5-liter flask having a stirrer and a thermometer, and 18.30 g of bis(3-amino-4-hydroxyphenyl)hexafluoropropane was added to the flask and dissolved in the solution by stirring. 8.53 g of pyridine was added thereto. While maintaining the temperature at 0 to 5° C., the solution of 4,4'-diphenyl ether dicarboxylic acid chloride obtained in the aforementioned procedure was added dropwise thereto over 30 minutes, and the resultant mixture was stirred for another 30 minutes. The solution thus obtained was poured into 3 liters of water, and the resulting precipitate was collected and washed with pure water three times, followed by vacuum drying, to obtain polyhydroxyamide (polybenzoxazole precursor) (hereinafter referred to as "polymer I"). Polymer I had a weight average molecular weight of 14,580 and a molecular weight distribution of 1.6, as measured by GPC using a calibration curve obtained from standard polystyrene.

Synthesis Example 2

Synthesis was conducted under the same conditions as in Synthesis Example 1 except that 20 mol % of 4,4'-diphenyl ether dicarboxylic acid was replaced with cyclohexane-1,4-dicarboxylic acid. The polyhydroxyamide thus obtained (hereinafter referred to as "polymer II") had a weight average molecular weight of 18,580 and a molecular weight distribution of 1.5, as measured by GPC using a calibration curve obtained from standard polystyrene.

Evaluation of Sensitivity Properties 100 parts by weight of the polybenzoxazole precursor (the component (a)) was mixed with the component (b) as a sensitizer, the latent acid generator (c) which generates acid upon heating, the compound (d) having a phenolic hydroxyl group, and the solvent (e) at predetermined amounts shown in the Table 1 below. 10 parts by weight of a 50% methanol solution of ureidopropyltriethoxysilane as an adhesion promoter was further added thereto. The resulting solution was subjected to pressurized filtration using a 3 μm pore Teflon® filter, to obtain a solution of a photosensitive resin composition.

TABLE 1

| | Component (a) | Component (b) | Component (c) | Component (d) | Component (e) |
|---|---|---|---|---|---|
| Example 1 | Polymer I | B1(10) | C1(2.5) | D1(10) | E1(160) |
| Example 2 | Polymer II | B1(11) | C2(2) | D1(10) | E1(160) |
| Example 3 | Polymer II | B1(10) | C3(3) | D1(10) | E1(160) |
| Example 4 | Polymer II | B2(10) | C4(2.5) | D2(10) | E1(160) |
| Example 5 | Polymer I | B2(10) | C5(1.5) | D2(10) | E1(160) |
| Example 6 | Polymer I | B2(10) | C6(1.5) | D2(10) | E1(160) |
| Example 7 | Polymer I | B3(12) | C7(4) | D1(8) | E1(160) |
| Example 8 | Polymer I | B3(11) | C8(2) | D1(8) | E1(160) |
| Example 9 | Polymer I | B3(10) | C9(3) | D1(8) | E1(160) |
| Example 10 | Polymer I | B1(11) | C10(2.5) | D2(10) | E1(160) |
| Example 11 | Polymer I | B1(11) | C11(2.5) | D2(10) | E1(160) |
| Example 12 | Polymer I | B1(11) | C12(2) | D2(10) | E2(160) |
| Example 13 | Polymer I | B3(12) | C13(1.5) | D1(10) | E2(160) |
| Example 14 | Polymer I | B3(12) | C14(8) | D1(10) | E2(160) |

In the Table, the figure in each pair of parentheses represents the amount of each component in terms of parts by weight relative to 100 parts by weight of the polymer.

Chemical formulae of the components (b) and components (c) in Table 1 are as follows:

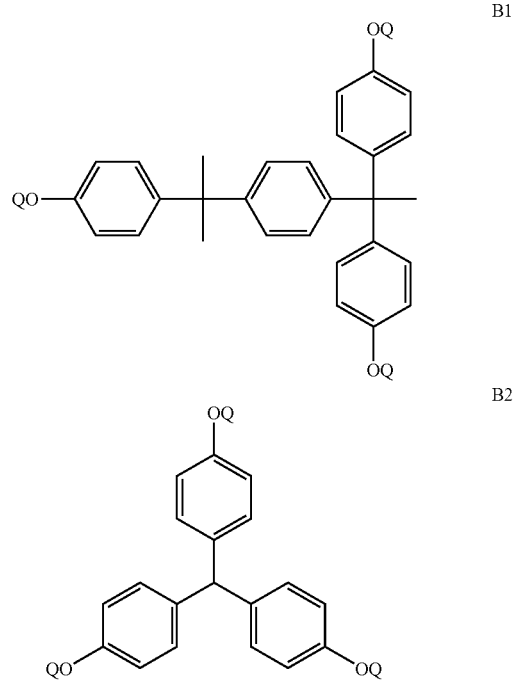

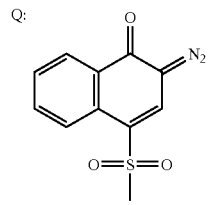
Q:
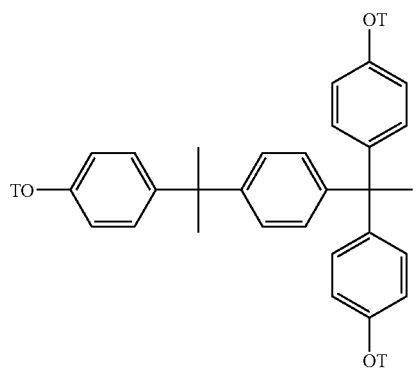
B3
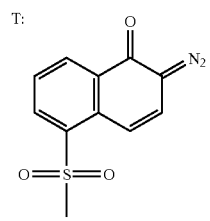
T:
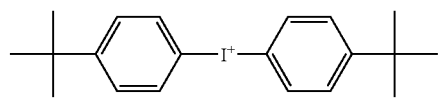
C1
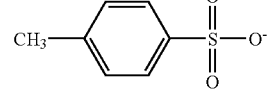
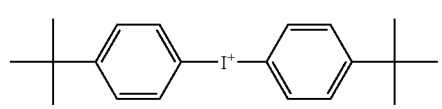
C2
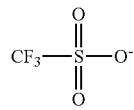
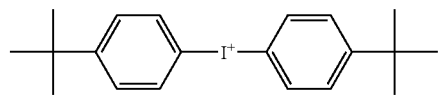
C3
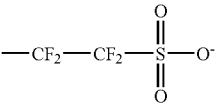
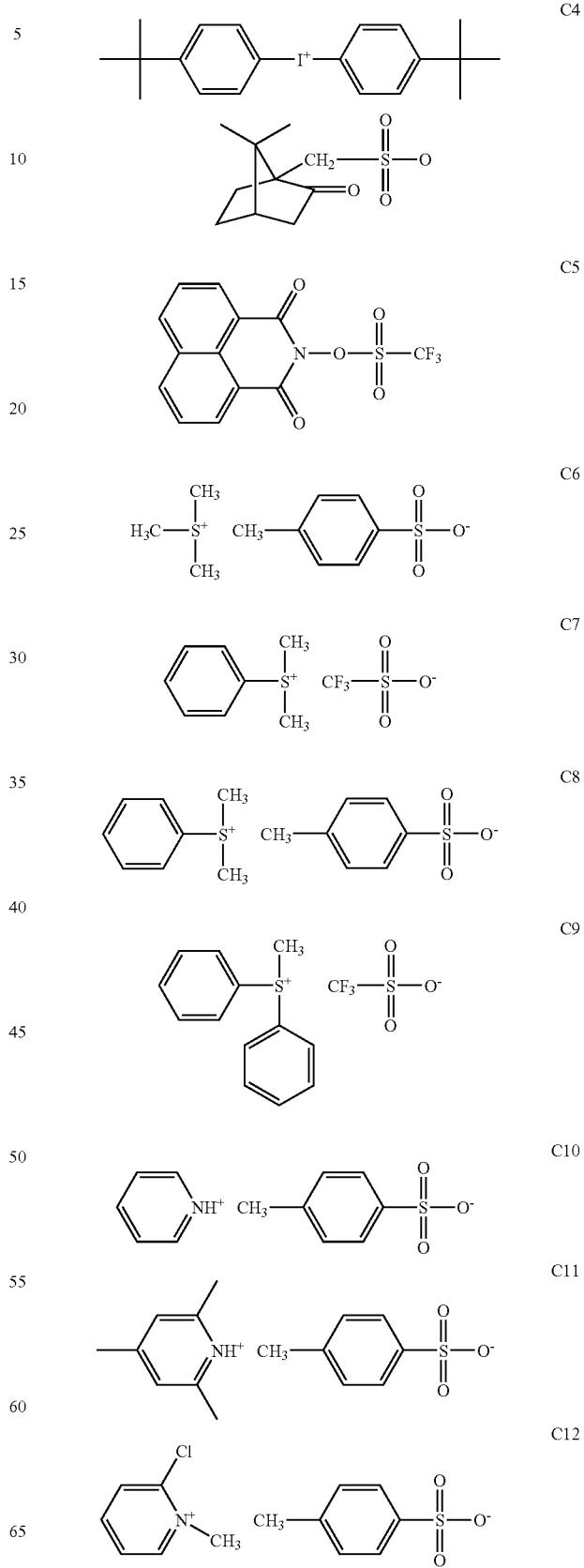

-continued

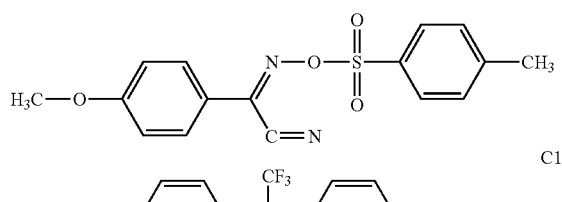
C13

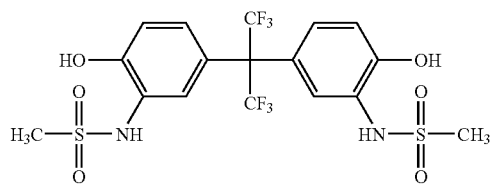
C14

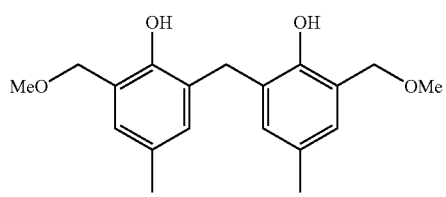
D1

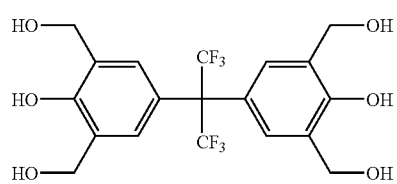
D2

As the component (e), E1 stands for γ-butyrolactone/propylene glycol monomethyl ether acetate=90/10 (parts by weight), and E2 stands for γ-butyrolactone/N-methyl-2-pyrrolidone=50/50 (parts by weight).

Each of the solutions obtained by the aforementioned procedure was applied onto a silicon wafer by spin coating and heated at 120° C. for 3 minutes, to form a coating film having a thickness of 11 to 13 μm. The film was then subjected to reduction projection exposure with i-line (365 nm) through a mask using an i-line stepper (FPA-3000iW; manufactured by CANON INC.). After the exposure, the resulting film was developed using a 2.38% aqueous solution of tetramethylammonium hydroxide so that the thickness of the residual film became about 70 to 90% of the initial thickness. The pattern was then rinsed with water, and examined for measuring minimum exposure energy required for forming the pattern and resolution. The results are shown in Table 2 below.

TABLE 2

|  | Sensitivity (mJ/cm$^2$) | Residual film ratio (%) | Resolution (μm) |
|---|---|---|---|
| Example 1 | 210 | 76 | 2 |
| Example 2 | 250 | 77 | 2 |
| Example 3 | 280 | 82 | 3 |
| Example 4 | 260 | 80 | 3 |
| Example 5 | 300 | 76 | 3 |
| Example 6 | 200 | 78 | 2 |
| Example 7 | 280 | 80 | 2 |
| Example 8 | 290 | 81 | 2 |
| Example 9 | 350 | 82 | 2 |
| Example 10 | 210 | 76 | 2 |
| Example 11 | 230 | 79 | 2 |
| Example 12 | 280 | 80 | 3 |
| Example 13 | 400 | 78 | 3 |
| Example 14 | 290 | 76 | 3 |

Furthermore, each of the solutions obtained by the aforementioned procedure was applied onto a silicon wafer by spin coating, and heated at 120° C. for 3 minutes, to form a coating film having a thickness of 15 μm. The film was then heated in a nitrogen atmosphere in an inert gas oven at 150° C. for 30 minutes, and then further heated at 300° C. for 1 hour or, alternatively, at 250° C. for 1 hour to obtain a cured film. Subsequently, the cured film was peeled off using an aqueous solution of hydrofluoric acid, and washed with water and dried. Physical properties of the film, i.e., glass transition temperature (Tg), water absorption, elongation (measured by means of a tensile tester), and 5% weight reduction temperature were measured. The results are shown in Table 3 below.

TABLE 3

|  | Curing temperature (° C.) | Tg (° C.) | Elongation (%) | Water absorption (%) | 5% Weight reduction temperature (° C.) |
|---|---|---|---|---|---|
| Example 1 | 250 | 285 | 44 | 0.63 | 461 |
|  | 300 | 299 | 46 | 0.60 | 483 |
| Example 2 | 250 | 275 | 43 | 0.91 | 454 |
|  | 300 | 283 | 45 | 0.88 | 460 |
| Example 3 | 250 | 277 | 42 | 0.62 | 453 |
|  | 300 | 285 | 44 | 0.59 | 459 |
| Example 4 | 250 | 274 | 39 | 0.63 | 451 |
|  | 300 | 283 | 46 | 0.58 | 458 |
| Example 5 | 250 | 282 | 46 | 1.02 | 451 |
|  | 300 | 298 | 48 | 0.97 | 471 |
| Example 6 | 250 | 284 | 20 | 1.10 | 450 |
|  | 300 | 297 | 25 | 1.05 | 472 |
| Example 7 | 250 | 285 | 24 | 1.03 | 454 |
|  | 300 | 296 | 26 | 0.99 | 473 |
| Example 8 | 250 | 284 | 23 | 0.98 | 452 |
|  | 300 | 298 | 22 | 0.89 | 477 |
| Example 9 | 250 | 286 | 18 | 0.89 | 453 |
|  | 300 | 297 | 23 | 0.88 | 477 |
| Example 10 | 250 | 286 | 23 | 0.81 | 460 |
|  | 300 | 298 | 23 | 0.77 | 485 |
| Example 11 | 250 | 284 | 43 | 0.78 | 460 |
|  | 300 | 297 | 46 | 0.75 | 484 |
| Example 12 | 250 | 283 | 20 | 1.01 | 457 |
|  | 300 | 296 | 23 | 0.98 | 473 |
| Example 13 | 250 | 286 | 24 | 0.84 | 456 |
|  | 300 | 295 | 26 | 0.78 | 480 |
| Example 14 | 250 | 284 | 25 | 1.05 | 458 |
|  | 300 | 298 | 25 | 1.03 | 475 |

As can be seen from Table 2, the photosensitive resin composition of the present invention has high sensitivity, and the composition can give a pattern with high resolution. As can be seen from Table 3, as to the elongation and water absorption, the physical properties of the film obtained by curing at 250° C. were comparable with those of the film obtained by curing at 300° C. As to the 5% weight reduction temperature, the films obtained by curing at 250° C. gave slightly lower results, although all of the films gave results of 450° C. or higher, which causes no practical problems. As to the film produced in Example 10, the amount of outgas when held at 300° C. for 1 hour was examined. As a result, the amount of outgas from the film cured at 250° C. was 1.3%, which is comparable with 0.95% from the film cured at 300° C.

Examples 15 to 22

Variations of curing method were studied as to the positive photosensitive resin composition solutions containing the materials used in Examples 1, 2, 3, 7, 8, 9, 10, and 11 shown in Table 1. Each of the positive photosensitive resin composition solutions was first applied onto a silicon wafer by spin coating, and heated at 120° C. for 3 minutes, to form a coating film having a thickness of 15 μm. The film was then cured by means of Microcure 2100, manufactured by Lambda Technologies Inc., at a microwave power of 450 W and a microwave frequency of 5.9 to 7.0 GHz while maintaining the substrate temperature at 200° C. for 2 hours, to obtain a cured film having a thickness of about 10 μm.

Subsequently, the cured film was peeled off using an aqueous solution of hydrofluoric acid, and washed with water and dried. Physical properties of the film, i.e., glass transition temperature (Tg), elongation, and 5% weight reduction temperature were measured. The results are shown in Table 4 below.

TABLE 4

| | Photosensitive resin composition | Tg (° C.) | Elongation (%) | 5% Weight reduction temperature (° C.) |
|---|---|---|---|---|
| Example 15 | Material in Example 1 | 283 | 40 | 457 |
| Example 16 | Material in Example 11 | 274 | 44 | 450 |
| Example 17 | Material in Example 11 | 275 | 44 | 451 |
| Example 18 | Material in Example 11 | 280 | 25 | 454 |
| Example 19 | Material in Example 11 | 282 | 26 | 449 |
| Example 20 | Material in Example 11 | 279 | 20 | 448 |
| Example 21 | Material in Example 11 | 283 | 21 | 455 |
| Example 22 | Material in Example 11 | 282 | 45 | 457 |

From the results of Examples 15 to 22, it was confirmed that the polyamide contained in the photosensitive resin composition of the present invention effectively undergoes ring-closing dehydration and is cured by irradiation with a pulse of microwave while changing a frequency and while maintaining the substrate temperature at 200° C. In addition, from the Table 4 above, it was confirmed that the cured film obtained by this method has a glass transition temperature, an elongation, and a 5% weight reduction temperature, which are comparable with the corresponding physical properties of the film formed in the ring-closing dehydration at 250° C. using a heating curing oven. These findings confirm that, by irradiation with a pulse of microwave while changing a frequency, the photosensitive resin composition of the present invention can be cured at a low temperature, compared to the temperature of curing using a generally used oven filled with nitrogen.

Comparative Examples 1 to 6

In the same manner as in Example 1, 100 parts by weight of the polybenzoxazole precursor (the component (a)) synthesized in the Synthesis Example was mixed with the component (b) as a sensitizer, the component (c), the compound (d) having a phenolic hydroxyl group, and the solvent (e) in the predetermined amounts shown in the Table 5 below. 10 parts by weight of a 50% methanol solution of ureidopropyltriethoxysilane as an adhesion promoter was further added thereto. In these Examples, the component (c) was not added, or was any one of compounds C15-C19 shown below. The resulting solution was subjected to pressurized filtration using a 3 μm pore Teflon® filter, to obtain a solution of a photosensitive resin composition.

TABLE 5

| | Component (a) | Component (b) | Component (c) | Component (d) | Component (e) |
|---|---|---|---|---|---|
| Comparative Example 1 | Polymer I | B1(10) | None | D2(10) | E1(160) |
| Comparative Example 2 | Polymer I | B1(10) | C14(2.5) | D2(10) | E1(160) |
| Comparative Example 3 | Polymer I | B1(10) | C15(3) | D2(10) | E1(160) |
| Comparative Example 4 | Polymer I | B2(10) | C16(3) | D1(10) | E1(160) |
| Comparative Example 5 | Polymer I | B2(10) | C17(3) | D1(10) | E1(160) |
| Comparative Example 6 | Polymer I | B2(10) | C18(2) | D1(10) | E1(160) |

In the Table, the figure in each pair of parentheses represents the amount of each component in terms of parts by weight relative to 100 parts by weight of the polymer.

Chemical formulae of the components (c) shown in Table 5 are as follows:

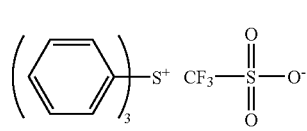

C15

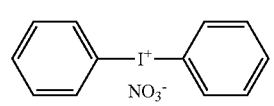

C16

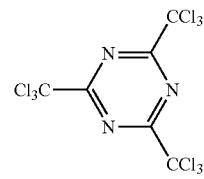

C17

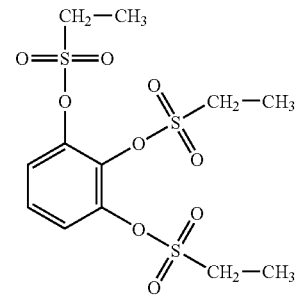

C18

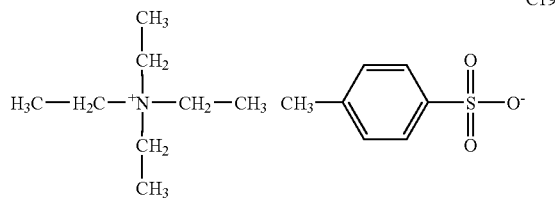

C19

Each of the solutions obtained by the aforementioned procedure was applied onto a silicon wafer by spin coating, and heated at 120° C. for 3 minutes, to form a coating film having a thickness of 11 to 13 μm. The film was then subjected to reduction projection exposure with i-line (365 nm) through a mask using an i-line stepper (FPA-3000iW; manufactured by CANON INC.). After the exposure, the resulting film was developed using a 2.38% aqueous solution of tetramethylammonium hydroxide so that the thickness of the residual film became about 70 to 90% of the initial thickness. The pattern was then rinsed with water, and examined for measuring minimum exposure energy required for forming the pattern and resolution. The results are shown in Table 6 below.

TABLE 6

|  | Sensitivity (mJ/cm$^2$) | Residual film ratio (%) | Resolution (μm) |
| --- | --- | --- | --- |
| Comparative Example 1 | 200 | 79 | 2 |
| Comparative Example 2 | 250 | 80 | 2 |
| Comparative Example 3 | 210 | 77 | 2 |
| Comparative Example 4 | 280 | 73 | 3 |
| Comparative Example 5 | 290 | 72 | 3 |
| Comparative Example 6 | 290 | 72 | 3 |

Further each of the solutions obtained by the aforementioned procedure was applied onto a silicon wafer by spin coating, and heated at 120° C. for 3 minutes, to form a coating film having a thickness of 15 μm. The film was then heated in a nitrogen atmosphere in an inert gas oven at 150° C. for 30 minutes, and then further heated at 300° C. for 1 hour or, alternatively, at 250° C. for 1 hour to obtain a cured film. Subsequently, the cured film was peeled off using an aqueous solution of hydrofluoric acid, and washed with water and dried. Physical properties of the film, i.e., glass transition temperature (Tg), water absorption, elongation, and 5% weight reduction temperature were measured. The results are shown in Table 7 below.

TABLE 7

|  | Curing temperature (° C.) | Tg (° C.) | Elongation (%) | Water absorption (%) | 5% Weight reduction temperature (%) |
| --- | --- | --- | --- | --- | --- |
| Comparative Example 1 | 250 | 277 | 40 | 1.56 | 439 |
|  | 300 | 299 | 42 | 1.10 | 480 |
| Comparative Example 2 | 250 | 275 | 18 | 1.66 | 435 |
|  | 300 | 298 | 20 | 1.24 | 475 |
| Comparative Example 3 | 250 | 278 | 39 | 1.57 | 440 |
|  | 300 | 299 | 42 | 1.12 | 479 |
| Comparative Example 4 | 250 | 276 | 17 | 1.58 | 436 |
|  | 300 | 298 | 19 | 1.34 | 478 |
| Comparative Example 5 | 250 | 275 | 20 | 1.56 | 437 |
|  | 300 | 299 | 22 | 1.14 | 479 |
| Comparative Example 6 | 250 | 273 | 16 | 1.87 | 435 |
|  | 300 | 293 | 18 | 1.55 | 475 |

As exhibited by the physical properties of films shown in Table 7, it is considered that the cyclodehydration reaction does not proceed completely in curing at 250° C. in the Comparative Examples, and the water absorption of the films obtained by curing at 250° C. was high, i.e., about 1.5%, as compared to the water absorption of the films obtained by curing at 300° C. The 5% weight reduction temperature of the films obtained by curing at 250° C. was lower than 450° C.

Examples 23 to 26

Synthesis Example 3

Synthesis of Hydroxyl Group-containing Diamine Compound (VII)

18.3 g (0.05 mol) of bis(3-amino-4-hydroxyphenyl) hexafluoropropane was dissolved in 100 ml of acetone and 17.4 g (0.3 mol) of propylene oxide under a dried nitrogen gas stream and cooled to −15° C. To the resulting solution was added dropwise a solution prepared by dissolving 20.4 g (0.11 mol) of 4-nitrobenzoyl chloride in 100 ml of acetone. After completion of the addition, the reaction was effected at −15° C. for 4 hours, and then the reaction mixture was left stand to room temperature. The white solid precipitate was collected by filtration and dried in a vacuum at 50° C. 30 g of the solid thus obtained was then placed in a 300-ml stainless steel autoclave, and dispersed in 250 ml of methyl cellosolve 2 g of 5% palladium-carbon was added thereto. Hydrogen was fed to the autoclave to effect a reduction reaction at room temperature. After the reaction was continued for about 2 hours, the palladium compound as a catalyst was removed by filtration, and the filtrate was concentrated by means of a rotary evaporator to obtain diamine compound (VII). The solid thus obtained was used as it is in the subsequent reaction.

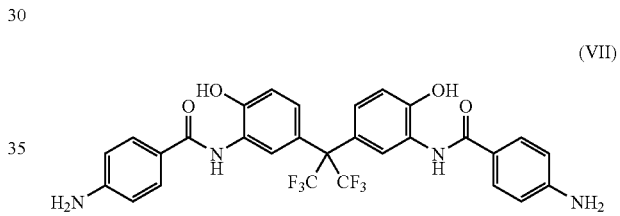

(VII)

Synthesis Example 4

Synthesis of Hydroxyl Group-containing Acid Anhydride (VIII)

18.3 g (0.05 mol) of bis(3-amino-4-hydroxyphenyl) hexafluoropropane and 34.2 g (0.3 mol) of allyl glycidyl ether were dissolved in 100 g of γ-butyrolactone under a dried nitrogen gas stream and cooled to −15° C. To the resulting solution was added dropwise 22.1 g (0.11 mol) of trimellitic anhydride chloride dissolved in γ-butyrolactone while controlling the temperature or the reaction mixture below 0° C. After completion of the addition, reaction was effected at 0° C. for 4 hours. The resulting solution was concentrated by means of a rotary evaporator, and poured into 1 L of toluene, to obtain acid anhydride (VIII).

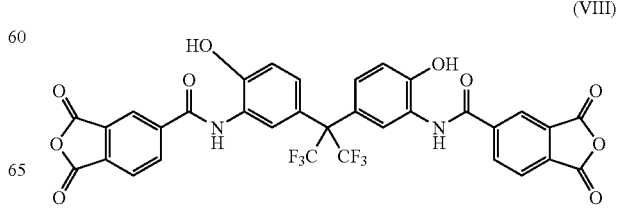

(VIII)

Synthesis Example 5

Synthesis of Poly(imide-benzoxazole) Precursor 15.1 g (0.025 mol) of hydroxyl group-containing diamine (VII) obtained in Synthesis Example 3 was dissolved in 50 g of N-methyl-2-pyrrolidone under a dried nitrogen gas stream. To the resulting solution were added 17.5 g (0.025 mol) of hydroxyl group-containing acid anhydride (VIII) obtained in Synthesis Example 4 and 30 g of pyridine, and reaction was effected at 60° C. for 6 hours. After completion of the reaction, the resulting solution was poured into 2 L of water, and the solid polymer precipitate was collected by filtration, and then washed with water, followed by vacuum drying, to obtain a poly(imide-benzoxazole) precursor (hereinafter referred to as "polymer III").

Synthesis Example 6

Synthesis of Poly(imide-benzoxazole) Precursor

Synthesis was conducted under the same conditions as in Synthesis Example 5, except that hydroxyl group-containing diamine (VII) was replaced with 5.01 g (0.025 mol) of 4,4'-diaminophenyl ether, to obtain a poly(imide-benzoxazole) precursor (hereinafter referred to as "polymer IV").

Operations were conducted in the same procedure as in Examples 1 to 14 except that, as shown in Table 8, polymer III or IV was used as the component (a) and N-methyl-2-pyrrolidone (hereinafter abbreviated as "E3") was used as the component (e) and the components (a) to (e) were blended in the amounts shown in Table 8, and the sensitivity properties of the resultant were evaluated. The results are shown in Tables 9 and 10 below.

TABLE 8

|  | Component (a) | Component (b) | Component (c) | Component (d) | Component (e) |
| --- | --- | --- | --- | --- | --- |
| Example 23 | Polymer III | B1(15) | C1(3) | D1(12) | E3(160) |
| Example 24 | Polymer III | B3(13) | C10(2.5) | D2(10) | E3(160) |
| Example 25 | Polymer IV | B1(20) | C1(3) | D1(13) | E3(160) |
| Example 26 | Polymer IV | B3(15) | C11(2.5) | D2(10) | E3(160) |

In the Table, the figure in each pair of parentheses represents an amount of each component in terms of parts by weight relative to 100 parts by weight of the polymer.

TABLE 9

|  | Sensitivity (mJ/cm$^2$) | Residual film ratio (%) | Resolution (μm) |
| --- | --- | --- | --- |
| Example 23 | 370 | 78 | 5 |
| Example 24 | 350 | 78 | 5 |
| Example 25 | 520 | 75 | 4 |
| Example 26 | 480 | 74 | 5 |

TABLE 10

|  | Curing temperature (° C.) | Tg (° C.) | Elongation (%) | Water absorption (%) | 5% Weight reduction temperature (%) |
| --- | --- | --- | --- | --- | --- |
| Example 23 | 250 | 273 | 14 | 1.15 | 452 |
|  | 300 | 305 | 15 | 1.09 | 465 |
| Example 24 | 250 | 278 | 13 | 1.19 | 451 |
|  | 300 | 300 | 16 | 1.08 | 460 |
| Example 25 | 250 | 277 | 16 | 1.21 | 447 |
|  | 300 | 299 | 17 | 1.14 | 453 |
| Example 26 | 250 | 280 | 15 | 1.20 | 448 |
|  | 300 | 302 | 17 | 1.15 | 455 |

As can be seen from Table 9, the photosensitive resin composition of the present invention has relatively high sensitivity, and the composition can give a pattern with high resolution. As can be seen from Table 10, as to the elongation and water absorption, the physical properties of the film obtained by curing at 250° C. were comparable with those of the film obtained by curing at 300° C. As to the 5% weight reduction temperature, the films obtained by curing at 250° C. gave slightly lower results, although all of the films gave results of 450° C. or higher, which have no practical problems.

INDUSTRIAL APPLICABILITY

As described above, the positive photosensitive resin composition of the present invention has excellent sensitivity, resolution and adhesion. Furthermore, even when it is used in a low-temperature curing process, a pattern having excellent heat resistance, low water absorption and configuration can be obtained from the composition. Thus, it is suitably used for fabricating electronic parts, particularly MRAM which is required to be produced in a low-temperature process.

The invention claimed is:

1. A positive photosensitive resin composition comprising:
   (a) alkaline aqueous solution-soluble polyamide having a polyoxazole precursor structure;
   (b) an o-quinonediazide compound; and
   (c) a latent acid generator which generates acid upon heating,
   wherein said component (c) is selected from the group consisting of:
   (c-1) imide sulfonate;
   (c-2) a compound having a structure $R^1R^2C\!=\!N\!-\!O\!-\!SO_2\!-\!R$, wherein R is selected from a group consisting of an aryl group, an alkyl group and a perfluoroalkyl group; $R^1$ is a cyano group; and $R^2$ is selected from a group consisting of a methoxyphenyl group and a phenyl group;
   (c-3) a compound having a structure $-\!HN\!-\!SO_2\!-\!R'$, wherein R' is selected from a group consisting of an alkyl group, an aryl group and a perfluoroalkyl group;
   (c-4) a salt formed from a strong acid and a base selected from a group consisting of alkyl pyridine, pyridine, N-alkyl pyridine and halogenated N-alkyl pyridine, said salt being other than onium salts; and
   combinations thereof.

2. The positive photosensitive resin composition according to claim 1, wherein the component (a) is a polyamide having a repeating unit represented by the following general formula (I):

$$-\!\!+\!\!NH-\underset{\underset{OH}{|}}{\overset{\overset{OH}{|}}{U}}-NH-\overset{\overset{O}{\|}}{C}-V-\overset{\overset{O}{\|}}{C}\!\!+\!\!- \quad (I)$$

wherein U represents a tetravalent organic group, and V represents a divalent organic group.

3. The positive photosensitive resin composition according to claim 1, wherein the component (c) has a decomposition starting temperature of 140 to 250° C.

4. The positive photosensitive resin composition according to claim 1, wherein the content of the component (b) and the content of the component (c) are 5 to 100 parts by weight and 0.1 to 30 parts by weight, respectively, relative to 100 parts by weight of the component (a).

5. A method for forming a pattern comprising the steps of:
applying a positive photosensitive resin composition onto a supporting substrate and drying the composition to obtain a photosensitive resin film;
exposing the photosensitive resin film to a ray of active light having a predetermined pattern;
developing the exposed photosensitive resin film using an alkaline aqueous solution; and
subjecting the developed photosensitive resin film to a heating treatment,
wherein said positive photosensitive resin composition comprises:
(a) alkaline aqueous solution-soluble polyamide having a polyoxazole precursor structure;
(b) an o-quinonediazide compound; and
(c) a latent acid generator which generates acid upon heating, said generator having a decomposition starting temperature of 140 to 250° C.; and
wherein the heating treatment is conducted at a temperature equal to or lower than 280° C.

6. The method according to claim 5, wherein the heating treatment is a treatment of irradiating the film with a pulse of microwave while changing the frequency thereof.

7. An electronic part comprising an electronic device having a layer of pattern obtained by the method for forming a pattern according to claim 5,
wherein the device comprises the layer of pattern provided therein as any one of an interlayer insulating layer and a surface protecting film layer or both.

8. The electronic part according to claim 7 which is MRAM.

* * * * *